United States Patent
Fukumi

(10) Patent No.: US 6,812,508 B2
(45) Date of Patent: Nov. 2, 2004

(54) SEMICONDUCTOR SUBSTRATE AND METHOD FOR FABRICATING THE SAME

(75) Inventor: Masayuki Fukumi, Tenri (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/993,897

(22) Filed: Nov. 27, 2001

(65) Prior Publication Data

US 2002/0063341 A1 May 30, 2002

(30) Foreign Application Priority Data

Nov. 28, 2000 (JP) ......................................... 2000-361979

(51) Int. Cl.⁷ ..................... H01L 27/148; H01L 29/768
(52) U.S. Cl. ......................... 257/244; 257/522; 257/622
(58) Field of Search ................................ 438/456, 422; 257/244

(56) References Cited

U.S. PATENT DOCUMENTS

| | | | | |
|---|---|---|---|---|
| 3,924,322 A | * | 12/1975 | Kurtz et al. ................. 438/456 |
| 4,169,000 A | * | 9/1979 | Riseman ..................... 257/510 |
| 4,671,846 A | * | 6/1987 | Shimbo et al. ............. 438/455 |
| 4,710,794 A | * | 12/1987 | Koshino et al. ............ 257/501 |
| 4,975,390 A | * | 12/1990 | Fujii et al. .................. 438/53 |
| 5,004,705 A | * | 4/1991 | Blackstone ........... 148/DIG. 11 |
| 5,089,431 A | * | 2/1992 | Slatter et al. ........ 148/DIG. 12 |
| 5,264,375 A | * | 11/1993 | Bang et al. ................. 505/330 |
| 5,286,671 A | * | 2/1994 | Kurtz et al. .......... 148/DIG. 12 |
| 5,335,550 A | * | 8/1994 | Satou .......................... 73/727 |
| 5,476,819 A | * | 12/1995 | Warren ...................... 438/456 |
| 5,476,820 A | * | 12/1995 | Fueki et al. .................. 438/55 |
| 5,543,349 A | * | 8/1996 | Kurtz et al. .......... 148/DIG. 12 |
| 5,620,614 A | * | 4/1997 | Drake et al. .................. 216/2 |
| 5,661,049 A | * | 8/1997 | Lur et al. .................... 438/303 |
| 5,668,033 A | * | 9/1997 | Ohara et al. ......... 148/DIG. 12 |
| 5,681,775 A | * | 10/1997 | Pogge ................. 148/DIG. 12 |
| 5,702,962 A | * | 12/1997 | Terasawa ............. 148/DIG. 12 |
| 5,726,453 A | * | 3/1998 | Lott et al. ............... 250/370.05 |
| 5,863,832 A | * | 1/1999 | Doyle et al. ......... 148/DIG. 12 |
| 5,930,651 A | * | 7/1999 | Terasawa ..................... 438/137 |
| 5,946,549 A | * | 8/1999 | Itoigawa et al. .............. 438/53 |
| 5,949,144 A | * | 9/1999 | Delgado et al. ............. 257/776 |
| 6,143,583 A | * | 11/2000 | Hays .......................... 438/107 |
| 6,225,192 B1 | * | 5/2001 | Aspar et al. ................ 438/455 |
| 6,284,621 B1 | * | 9/2001 | Chang et al. ............... 438/411 |
| 6,448,624 B1 | * | 9/2002 | Ishio et al. .................. 257/417 |
| 6,503,847 B2 | * | 1/2003 | Chen et al. ................. 438/780 |

FOREIGN PATENT DOCUMENTS

| | | |
|---|---|---|
| EP | 0 809 288 | 11/1997 |
| JP | 03-174740 | 7/1991 |
| JP | 3-196644 A | 8/1991 |
| JP | 11-243039 | 9/1999 |
| KR | 1994-0008557 | 9/1994 |
| KR | 1999-0063517 | 7/1999 |

OTHER PUBLICATIONS

Korean Office Action dated Jul. 31, 2003.
European Search Report dated Mar. 11, 2004.
"Sacrifical Wafer Bonding for Planarization After Very Deep Etching", Spiering et al., Journal of Microelectromechanical Systems, Sep. 1995, No. 3, pp. 151–157 XP000531458.
Abstract 01128164.9 (1pg).

* cited by examiner

Primary Examiner—John F. Niebling
Assistant Examiner—Angel Roman
(74) Attorney, Agent, or Firm—Nixon & Vanderhye P.C.

(57) ABSTRACT

A semiconductor substrate device comprises a first semiconductor substrate including a concave-convex surface and a second semiconductor substrate having an insulating film on a surface thereof. The first semiconductor substrate and the second semiconductor substrate are brought together so that the surface of the first semiconductor substrate and the insulating film provided on the surface of the second semiconductor substrate contact each other to form a cavity in the semiconductor substrate device.

2 Claims, 5 Drawing Sheets

SEMICONDUCTOR SUBSTRATE AND METHOD FOR FABRICATING THE SAME

BACKGROUND OF THE INVENTION

1. Field of the Invention

The present invention relates to a semiconductor substrate device in which a parasitic capacitance generated between the semiconductor substrate and circuit elements such as metal wiring, passive elements, active elements, and the like is reduced; and a method for fabricating the semiconductor substrate device.

2. Description of the Related Art

In recent years, the market of mobile multimedia devices using radio communication, including portable information devices, such as digital cordless phones, e.g., digital mobile phones and PHS (personal handy-phone system) devices, has been expanded. In the research institutes of manufacturers of mobile multimedia devices, colleges, and the like, techniques for improving high-frequency characteristics of a high-frequency device (e.g., a thin-film transistor) used in the mobile multimedia devices are being actively studied. One of the ways to improve the high-frequency characteristics is to reduce a parasitic capacitance generated between a semiconductor substrate, such as a silicon substrate, and circuit elements including wiring, such as metal wiring, and including elements, such as passive elements and active elements.

Methods for fabricating a semiconductor device in which the parasitic capacitance is reduced so as to improve the high-frequency characteristics are disclosed in, for example, Japanese Laid-Open Publication No. 03-196644 (hereinafter, referred to as "document 1") and IEEE TRANSACTIONS ON ELECTRON DEVICES, Vol. 45, No. 5, May 1998, pp. 1039–1045 (hereinafter, referred to as "document 2").

First, a method of document 1 will be described with reference to FIGS. 4A to 4D.

FIGS. 4A to 4D are cross-sectional views, each illustrating a step of a fabrication method of a semiconductor integrated circuit in which parasitic capacitance is reduced.

(1) As shown in FIG. 4A, on a top surface of a semiconductor substrate 1 which includes a circuit element (not shown), a bonding pad 2 is provided in a predetermined position. The semiconductor substrate 1 is polished from a bottom surface to have a thickness of about 150 μm.

(2) As shown in FIG. 4B, photoresist layers 7 and 8 each having a thickness of 2 to 5 μm are respectively formed on the entire top and bottom surfaces of the semiconductor substrate 1 covering the bonding pad 2. Then, an opening 8a is formed in the photoresist layer 8 on the bottom surface of the semiconductor substrate 1 in a position opposing the bonding pad 2.

(3) As shown in FIG. 4C, a cavity 3 is formed in a bottom portion of the semiconductor substrate 1 by isotropic wet etching using the photoresist layers 7 and 8 as masks. An etchant including sulfuric acid, hydrogen peroxide, and water at a ratio of 1 to 4:1:1 is used.

(4) As shown in FIG. 4D, the photoresist layers 7 and 8 are removed. Thereafter, a silicon nitride film 6 is deposited on an inner surface of the cavity 3. Then, the resultant laminate is mounted on a metallized layer 5 of a ceramic package 4.

In the semiconductor integrated circuit fabricated by steps (1) to (4), the cavity 3 is formed in the bottom portion of the semiconductor substrate 1 in a position opposing the bonding pad 2. By providing the cavity 3 at this position, the parasitic capacitance generated between the semiconductor substrate 1 and the bonding pad 2 can be reduced.

Next, a method of document 2 will be described. Document 2 describes a method for fabricating a semiconductor device (e.g., a Silicon on Insulator (SOI) substrate device) in which parasitic capacitance generated between a substrate and a circuit element Is reduced. An inductor of the semiconductor device, which is a passive element, is used in a high-frequency device along with the semiconductor device. The parasitic capacitance generated between the substrate and the inductor is reduced, and thus a quality factor of the inductor is improved. Therefore, high-frequency characteristics of the high-frequency device are improved.

FIGS. 5A to 5E are cross-sectional views, each illustrating a step of a fabrication method of the semiconductor device.

(1) As shown in FIG. 5A, an insulating layer 11 having a thickness of 70 nm is laminated on an SOI substrate 10 having a thickness of 300 nm. Then, two gate oxide films 13 and an element isolation film 12 are formed on the insulating layer 11 by a LOCOS (Local Oxidation of Silicon) method. The two gate oxide films 13 straddle the element isolation film 12. A gate electrode 14 is formed on each of the gate oxide films 13.

(2) As shown in FIG. 5B, tungsten (W) films 15 are grown on each of the gate electrodes 14, and on source and a drain regions formed on either side of each of the gate electrodes 14 by a selective CVD (Chemical Vapor Deposition) method. Thus, aplurality of elements 19 are formed.

(3) As shown in FIG. 5C, on the tungsten films 15 above the source and drain regions, three-layer metal wiring is formed. Aluminum (Al) wiring 16, forming an inductor, is formed on a top surface of the three-layer metal wiring. Then, a passivation process is performed. Thus, a circuit element is formed.

(4) As shown in FIG. 5D, an opening 17 is provided by anisotropic etching. The opening 17 penetrates the laminate from the top surface of the three metal wiring to a top surface of the SOI substrate 10.

(5) As shown in FIG. 5E, a cavity 18 having a depth of about 100 nm from the top surface of the SOI substrate 10 is formed. The cavity 18 is formed by isotropic etching in which sulfur fluoride ($SF_6$) is injected through the opening 17. The cavity 18 extends under one of the elements 19 which is closest to the opening 17.

As a result of performing steps (1) to (5), semiconductor device is provided in which the parasitic capacitance generated between the SOI substrate 10 and the inductor 16 is reduced by providing the capacity 18. The semiconductor device having such a structure allows the inductor 16 to have improved high-frequency characteristics.

In the methods described in each of the documents 1 and 2, the parasitic capacitance generated between the substrate and the circuit elements can be reduced by forming a cavity having a low dielectric constant in the semiconductor substrate in a portion below the circuit elements (wiring, elements, and the like).

However, these methods have the following problems.

(1) It is required to form a cavity in a semiconductor substrate after the circuit elements and the like are formed on the semiconductor substrate to fabricate an LSI or the like. Accordingly, the number of steps of the fabrication method increases and the circuit elements formed on the substrate may be damaged when forming the cavity.

(2) Especially, in the method of document 2, it is required to reserve a region for forming an opening which penetrates a semiconductor substrate of a semiconductor device from a top surface having the circuit elements thereon. Thus, when the arrangement of multi-layer wiring becomes complicated and circuit elements are positioned close to each other, accurately forming an opening becomes difficult.

SUMMARY OF THE INVENTION

According to one aspect of the invention, there is provided a semiconductor substrate device, comprising: a first semiconductor substrate including a concave-convex surface; and a second semiconductor substrate having an insulating film on a surface thereof. The first semiconductor substrate and the second semiconductor substrate are brought together so that the surface of the first semiconductor substrate and the insulating film provided on the surface of the second semiconductor substrate contact each other to form a cavity in the semiconductor substrate device.

In one embodiment of the invention, the concave-convex surface of the first semiconductor substrate is defined by a plurality of convex portions formed at equal intervals.

According to another aspect of the invention, there is provided a method for fabricating a semiconductor substrate device, comprising the steps of: providing a resist layer having a predetermined pattern on a first insulating film on a first semiconductor substrate; performing isotropic or anisotropic etching of the first insulating film by using the resist layer as a mask, and performing anisotropic etching of the first semiconductor substrate by using the resist layer as a mask to form a concave-convex portion in a surface of the first semiconductor substrate to provide the first semiconductor substrate with the concave-convex surface; and removing the resist layer and the first insulating film, and then bringing the first semiconductor substrate and a second semiconductor substrate together so that the surface of the first semiconductor substrate and a second insulating film provided on a surface of the second semiconductor substrate contact each other.

In one embodiment of the invention, the method further comprises the step of thinning the second semiconductor substrate from a surface opposite to the surface thereof provided with the second insulating film after the step of bringing the first semiconductor substrate and the second semiconductor substrate together.

In one embodiment of the invention, the anisotropic etching of the first semiconductor substrate is performed by using KOH.

Thus, the invention described herein makes possible the advantages of providing a semiconductor substrate device which ensures the reduction of parasitic capacitance when elements are provided thereon, and a method for fabricating the semiconductor substrate device.

These and other advantages of the present invention will become apparent to those skilled in the art upon reading and understanding the following detailed description with reference to the accompanying figures.

DESCRIPTION OF THE PREFERRED EMBODIMENTS

Embodiment 1

Hereinafter, a semiconductor substrate device and a fabrication method of the semiconductor substrate device according to Embodiment 1 of the present invention will be described in detail with reference to FIGS. 1A to 1E.

FIGS. 1A to 1E are cross-sectional views, each illustrating a step of the fabrication method of the semiconductor substrate device according to Embodiment 1 of the present invention.

Figure 1A:
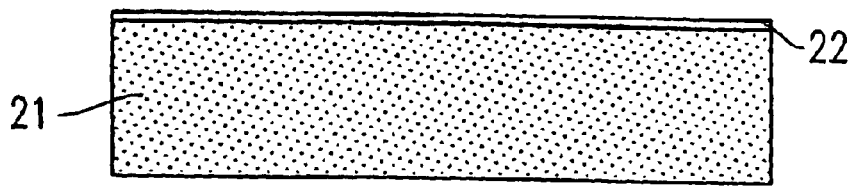
FIGS. 1A to 1E are cross-sectional views, each illustrating a step of a fabrication method of a semiconductor substrate device according to Embodiment 1 of the present invention.

(1) As shown in FIG. 1A, a first semiconductor substrate 21 is prepared. A first silicon oxide film 22 having a thickness of about 20 nm is formed on atop surface of the first semiconductor substrate 21. The first semiconductor substrate 21 contains, for example, silicon.

Figure 1B:
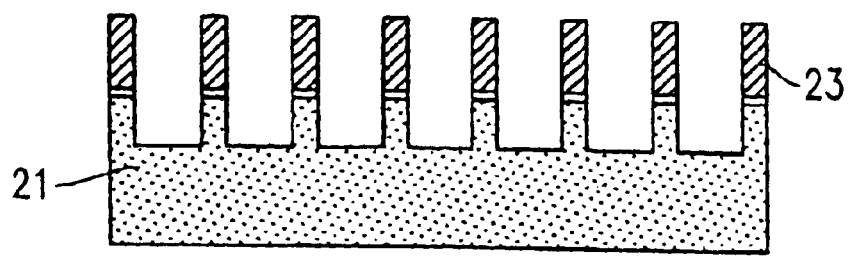

(2) As shown in FIG. 1B, a resist layer 23 patterned to have a plurality of square areas at equal intervals is formed on the first silicon oxide film 22 by using a photolithography technique. Then, using the resist layer 23 as a mask, a region in the first silicon oxide film 22 corresponding to the opening of the resist layer 23 is removed by anisotropic etching or isotropic etching. Subsequently, using the resist layer 23 as a mask again, a region in the first semiconductor substrate 21 corresponding to the opening of the resist layer 23 is removed by dry etching. The first semiconductor substrate 21 is etched to a depth of about 1.5 $\mu$m from a top surface of the semiconductor substrate 21 and the obtained etched surface is substantially flat.

Figure 1C:
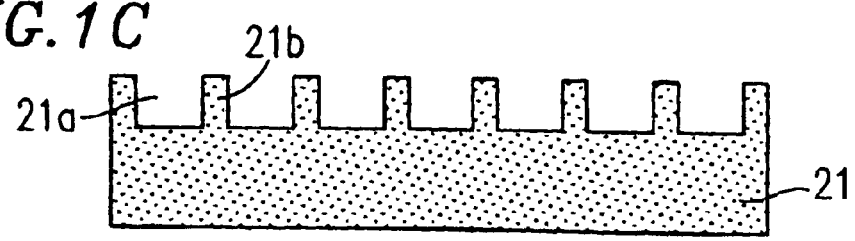
Figure 2:
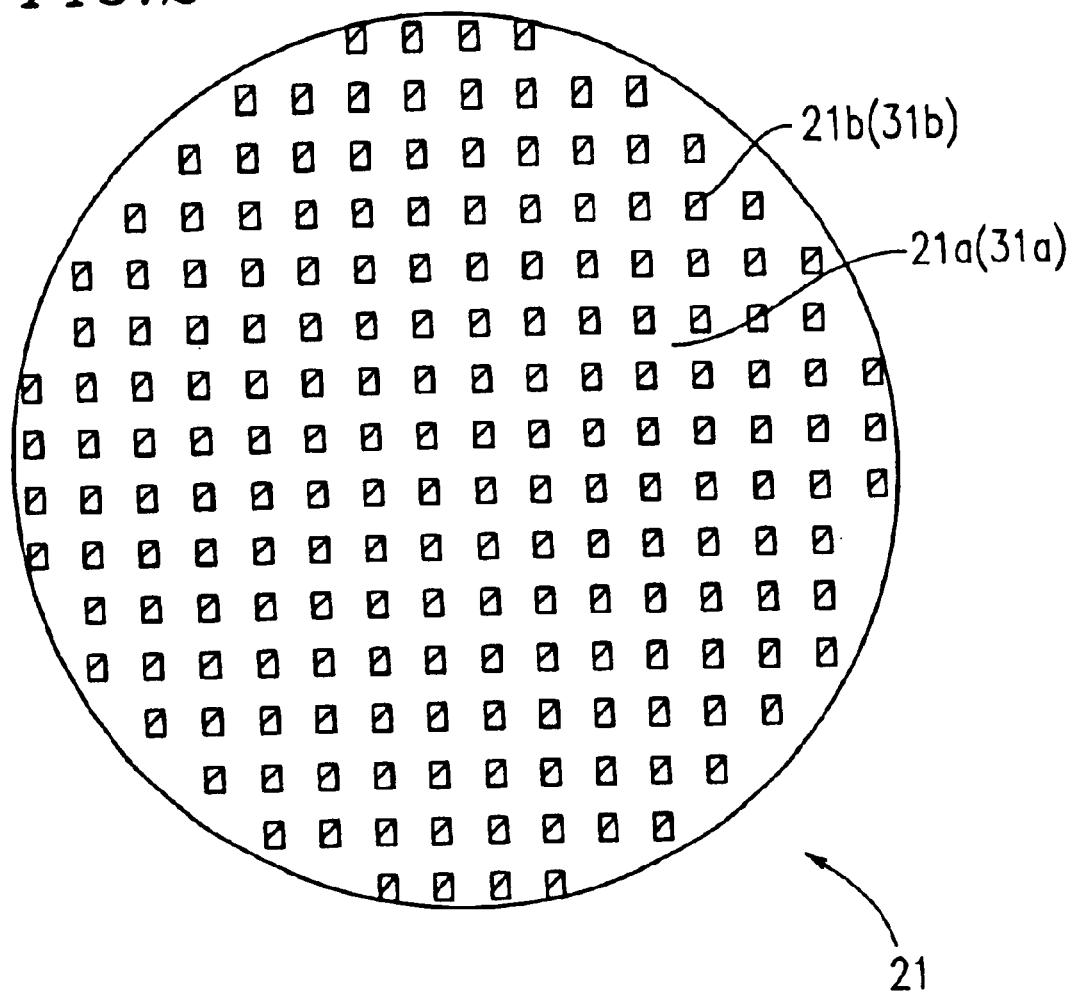
FIG. 2 is a plan view of a first semiconductor substrate used for the semiconductor substrate device according to Embodiment 1 of the present invention.

(3) As shown in FIG. 1C, the resist layer 23 and remaining portions of the first silicon oxide film 22 are removed. As a result, as shown in FIG. 2, the first semiconductor substrate 21 having a plurality of convex portions 21$b$ in a substantially flat concave portion 21$a$ is obtained. The convex portions 21$b$ have square cross sections and are positioned at equal intervals across the entire surface of the wafer. Thus, the semiconductor substrate 21 has a concave-convex surface.

Figure 1D:
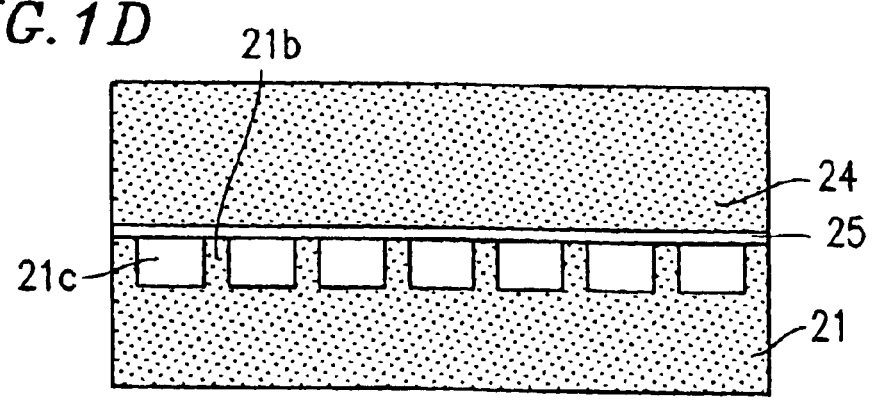

(4) As shown in FIG. 1D, a second semiconductor substrate 24 having an oxide film 25 on a surface thereof is prepared. The second semiconductor substrate 24 and the first semiconductor substrate 21 are brought together by an ELTRAN (Epitaxial Layer Transfer) method so that the oxide film 25 and the concave-convex surface of the first semiconductor substrate 21 contact each other.

In an ELTRAN method, a thin-film Si layer is epitaxially grown on a first semiconductor substrate. The first semiconductor substrate and a second semiconductor substrate are brought together so that the two substrates sandwich the thin-film Si layer. Then, heat treatment is performed to improve adherence strength between the two substrates.

For bringing the first semiconductor substrate 21 and the second semiconductor substrate 24 together, other methods, such as a UNIBOND method, may be used.

In a UNIBOND method, hydrogen ions are implanted to a first semiconductor substrate. A second semiconductor substrate has a silicon oxide film. By utilizing a brittle fracture property of hydrogen-ion-implanted regions, the first semiconductor substrate and the second semiconductor substrate are brought together so that the two substrates sandwich the silicon oxide film. Then, heat treatment is performed.

Figure 1E:
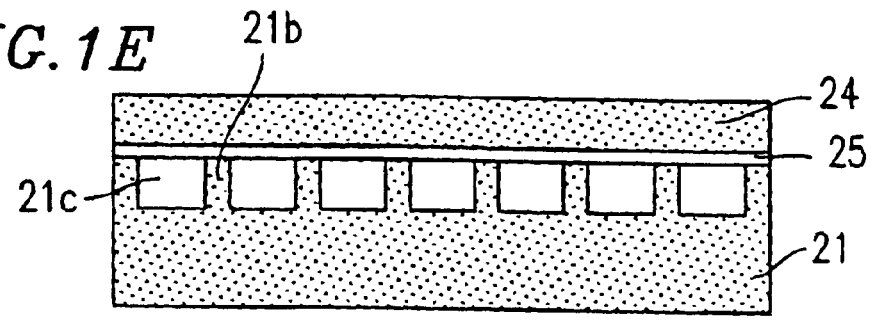

(5) As shown in FIG. 1E, the second semiconductor substrate 24 is polished from the opposite surface to the surface adhering to the first semiconductor substrate 21 to form a thin film. Thus, an SOI substrate device (i.e., the semiconductor substrate device) having a desired thickness is obtained.

In the semiconductor substrate device fabricated by steps (1) to (5) described above, a cavity 21c is formed in the first semiconductor substrate 21 before forming circuit elements (not shown). Therefore, it is not required to form the cavity 21c in the semiconductor substrate device after forming the circuit elements. Accordingly, damages to the circuit elements which may occur when forming cavities after the circuit elements are formed can be avoided, unlike in the methods of documents 1 and 2.

Furthermore, according to the present invention, it is not required to form openings which penetrate through the semiconductor substrate from the surface of the semiconductor substrate device having the circuit elements thereon, unlike the semiconductor integrated circuit of document 2. Therefore, the semiconductor substrate device of the present invention can be preferably used for a high-frequency device which has a complicated arrangement.

Heat treatment performed for forming the circuit elements may cause an excessive thermal expansion of the cavity 21c in the first semiconductor substrate 21 in the semiconductor substrate device of the present invention. Even in such a case, the thermal stress is uniform across the semiconductor substrate device because the convex portions 21b are equally spaced in the first semiconductor substrate 21. Therefore, defects in the semiconductor substrate device, such as cracks, caused by uneven stress can be avoided.

In the first semiconductor substrate 21, the size of the convex portions 21b is preferably as small as possible, but is sufficiently large so as to provide a sufficient adherence strength between the first semiconductor substrate 21 and the second semiconductor substrate 24, for example.

Embodiment 2

Now, a semiconductor substrate device and a fabrication method of the semiconductor substrate device according to Embodiment 2 of the present invention will be described in detail with reference to FIGS. 3A to 3E.

FIGS. 3A to 3E are cross-sectional views, each illustrating a step of the fabrication method of the semiconductor substrate device according to Embodiment 2 of the present invention.

Figure 3A:
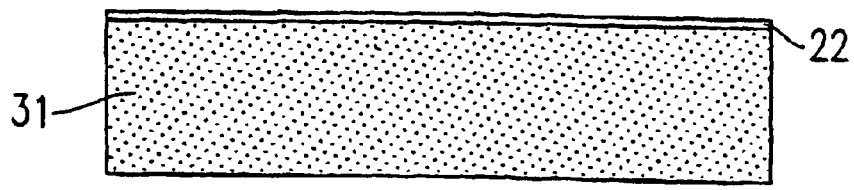
FIGS. 3A to 3E are cross-sectional views, each illustrating a step of a fabrication method of a semiconductor substrate device according to Embodiment 2 of the present invention.

(1) As shown in FIG. 3A, a first semiconductor substrate 31 is prepared by forming a first silicon oxide film 22 having a thickness of about 20 nm on a top surface of the first semiconductor substrate 31. The first semiconductor substrate 31 contains, for example, silicon.

Figure 3B:
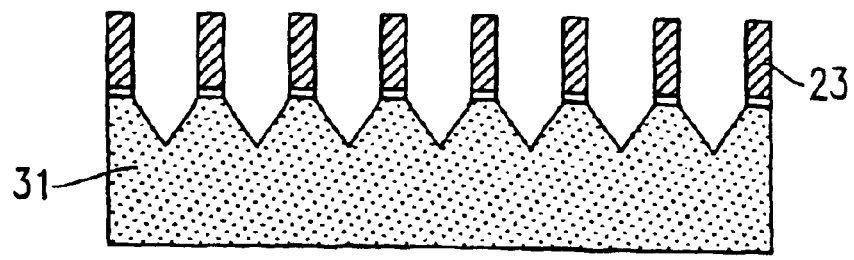

(2) As shown in FIG. 3B, a resist layer 23 patterned to have a plurality of square areas at equal intervals is formed on the first silicon oxide film 22 by using a photolithography technique. Then, using the resist layer 23 as a mask, a region in the first silicon oxide film 22 corresponding to the opening of the resist layer 23 is removed by anisotropic etching or isotropic etching. Subsequently, using the resist layer 23 as a mask again, a region in the first semiconductor substrate 31 corresponding to the opening of the resist layer 23 is removed. By using an anisotropic etchant, such as KOH, the first semiconductor substrate 31 is etched to a depth of about 1.5 $\mu$m so that the width of a concave portion 31a formed narrows as the depth of the concave portion 31a increases (shown as triangular shaped concave portions in FIG. 3B, for example).

Figure 3C:
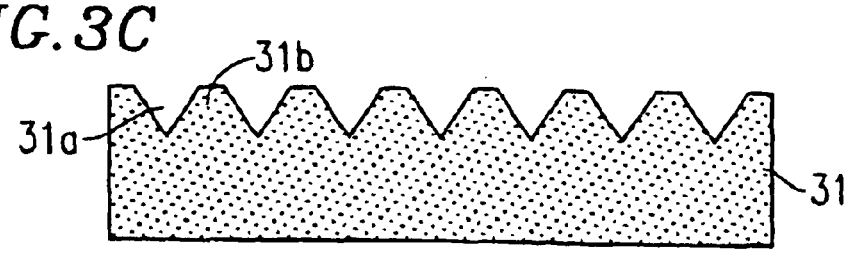

(3) As shown in FIG. 3C, the resist layer 23 and remaining portions of the first silicon oxide film 22 are removed. As a result, as shown in FIG. 2, the first semiconductor substrate 31 having a plurality of convex portions 31b in the concave portion 31a is obtained. The convex portions 31b have square cross sections and are positioned at equal intervals across the entire surface of the wafer. Thus, the semiconductor substrate 31 has a concave-convex surface.

Figure 3D:
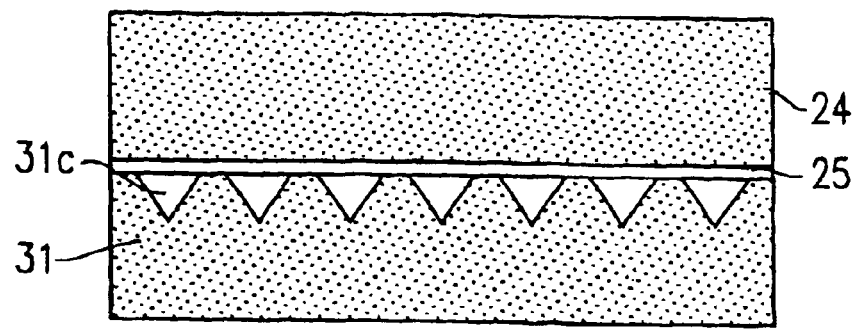

(4) As shown in FIG. 3D, a second semiconductor substrate 24 having an oxide film 25 on a surface is prepared. The second semiconductor substrate 24 and the first semiconductor substrate 31 are brought together by an ELTRAN (Epitaxial Layer Transfer) method so that the oxide film 25 and the concave-convex surface of the first semiconductor substrate 31 contact each other.

For bringing the first semiconductor substrate 31 and the second semiconductor substrate 24 together, other methods, such as a UNIBOND method may be used.

Figure 3E:
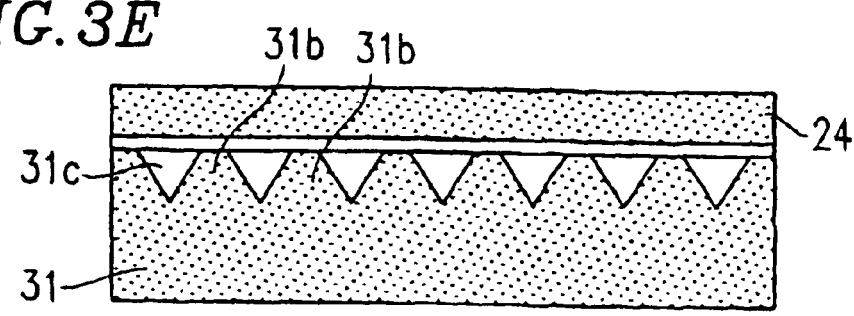
Figure 4A:
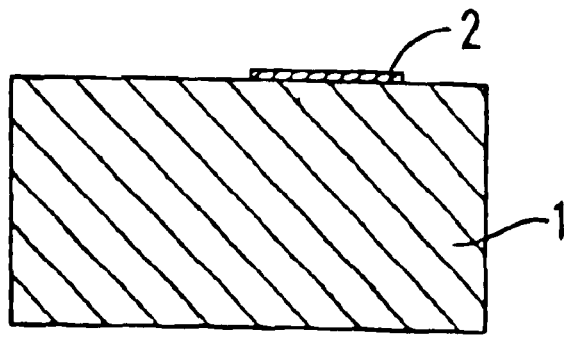
FIGS. 4A to 4D are cross-sectional views, each illustrating a step of a fabrication method of a semiconductor integrated circuit according to document 1.
Figure 4B:
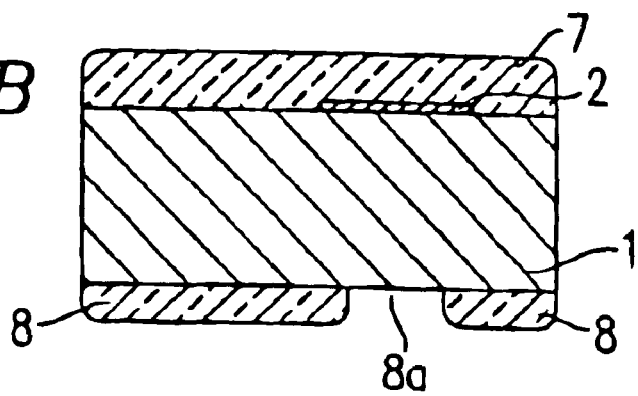
Figure 4C:
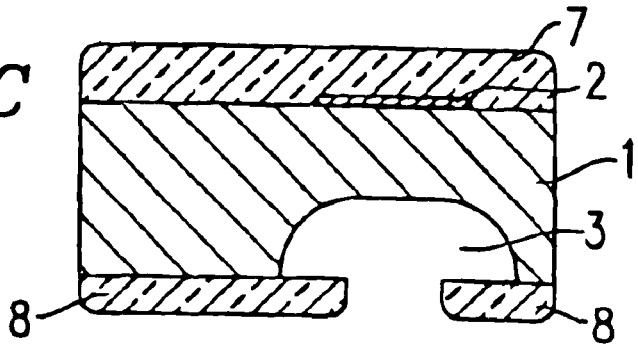
Figure 4D:
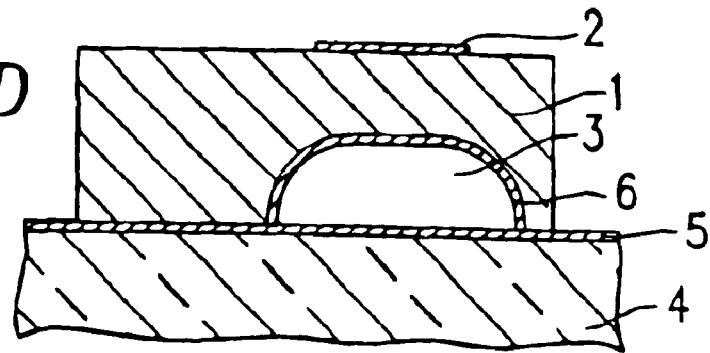
Figure 5A:
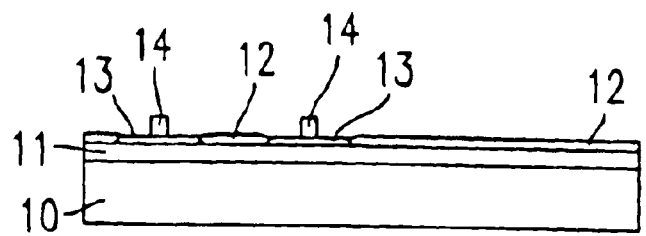
FIGS. 5A to 5E are cross-sectional views, each illustrating a step of a fabrication method of a semiconductor device according to document 2.
Figure 5B:
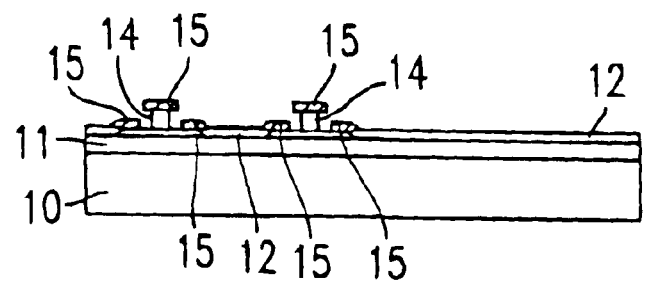
Figure 5C:
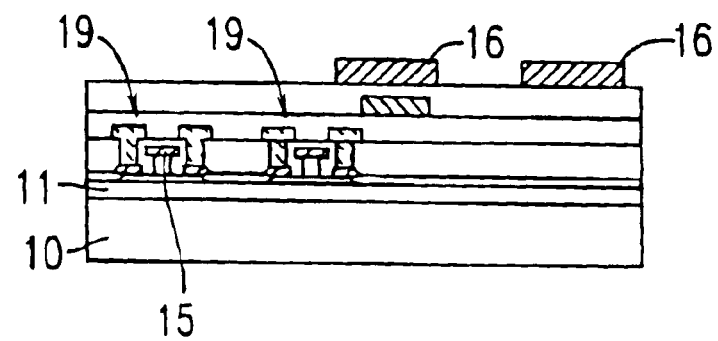
Figure 5D:
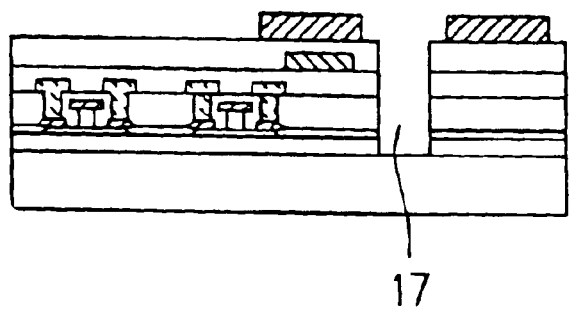
Figure 5E:
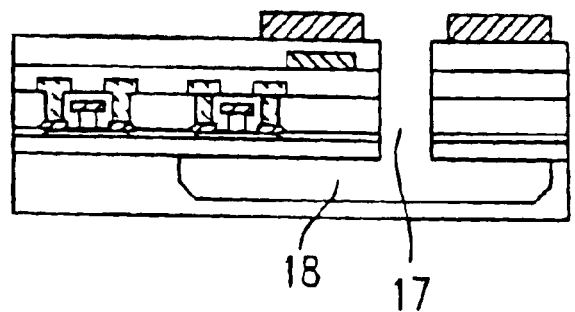

(5) As shown in FIG. 3E, the second semiconductor substrate 24 is polished from the opposite surface to the surface adhering to the first semiconductor substrate 31 to form a thin film. Thus, an SOI substrate device (i.e., the semiconductor substrate device) having a desired thickness is obtained.

In the semiconductor substrate device fabricated by steps (1) to (5) described above, a cavity 31c is formed in the first semiconductor substrate 31 before forming circuit elements (not shown). Therefore, it is not required to form the cavity 31c in the semiconductor substrate device after forming the circuit elements. Accordingly, damages to circuit elements which may occur when forming cavities after the circuit elements are formed can be avoided, unlike in the methods of documents 1 and 2.

Furthermore, according to the present invention, it is not required to form openings which penetrate through the semiconductor substrate from the surface of the semiconductor substrate device having the circuit elements thereon, unlike the semiconductor integrated circuit of document 2. Therefore, the semiconductor substrate device of the present invention can be preferably used for a high-frequency device which has a complicated arrangement.

Heat treatment performed for forming the circuit elements may cause an excessive thermal expansion of the cavity 31c in the first semiconductor substrate 31 in the semiconductor substrate device of the present invention. Even in such a case, the thermal stress is uniform across the semiconductor substrate device because the convex portions 31b are equally spaced in the first semiconductor substrate 31. Therefore, defects in the semiconductor substrate device, such as cracks, caused by uneven stress can be avoided.

A semiconductor substrate device according to the present invention has a cavity, without any circuit elements. When the circuit elements are provided on the semiconductor substrate device, the cavity in the semiconductor substrate device serves as a low dielectric constant portion, and thus parasitic capacitance generated between the substrate and the circuit elements, which may cause deterioration of high-frequency characteristics of a high-frequency device associated with the semiconductor substrate device, is reduced. Therefore, the semiconductor substrate device according to the present invention has good high-frequency characteristics and can be preferably used for the high-frequency device.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor substrate device, comprising:
   a first semiconductor substrate including a concave-convex surface, the concave-convex surface comprising a convex portion including a top surface; and
   a second semiconductor substrate having a thin film oxide insulator on a surface thereof, the surface of the second semiconductor substrate on which the thin film oxide insulator is provided being implanted with hydrogen ions,
   wherein the first semiconductor substrate and the second semiconductor substrate are brought together so that the top surface of the convex portion of the concave-convex surface of the first semiconductor substrate and the thin film oxide insulator provided on the ion implanted surface of the second semiconductor substrate contact each other with no circuit or device element located therebetween, to form a two-dimensional array of cavities in the semiconductor substrate device.

2. The device of claim 1, wherein the two-dimensional array of cavities serve as respective low dielectric constant portions so that parasitic capacitance generated between the first substrate and circuit elements on the second substrate is reduced.

* * * * *